(12) United States Patent
Pandey et al.

(10) Patent No.: US 10,619,235 B2
(45) Date of Patent: Apr. 14, 2020

(54) EFFECTIVE AND NOVEL DESIGN FOR LOWER PARTICLE COUNT AND BETTER WAFER QUALITY BY DIFFUSING THE FLOW INSIDE THE CHAMBER

(71) Applicant: Applied Materials, Inc., Santa Clara, CA (US)

(72) Inventors: Vishwas Kumar Pandey, Madhya Pradesh (IN); Kartik Shah, Saratoga, CA (US); Edric Tong, Sunnyvale, CA (US); Prashanth Vasudeva, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 350 days.

(21) Appl. No.: 15/415,916

(22) Filed: Jan. 26, 2017

(65) Prior Publication Data
US 2017/0349994 A1     Dec. 7, 2017

Related U.S. Application Data

(60) Provisional application No. 62/379,987, filed on Aug. 26, 2016, provisional application No. 62/345,631, filed on Jun. 3, 2016.

(51) Int. Cl.
*C23C 16/40*     (2006.01)
*C23C 8/24*     (2006.01)
(Continued)

(52) U.S. Cl.
CPC .............. *C23C 8/24* (2013.01); *C23C 16/455* (2013.01); *C23C 16/45568* (2013.01);
(Continued)

(58) Field of Classification Search
CPC ................ C23C 8/24; C23C 16/45582; C23C 16/45568; C23C 16/455; H01L 21/02614; H01L 21/02247
(Continued)

(56) References Cited

U.S. PATENT DOCUMENTS

2004/0069225 A1    4/2004   Fairbairn et al.
2005/0223986 A1   10/2005   Choi et al.
(Continued)

FOREIGN PATENT DOCUMENTS

| CN | 105580107 A | 5/2016 |
|---|---|---|
| KR | 10-2013-0007149 | 1/2013 |
| KR | 10-2014-0104180 | 8/2014 |

OTHER PUBLICATIONS

International Search Report and Written Opinion dated Apr. 21, 2017 for Application No. PCT/US2017/014864.
(Continued)

*Primary Examiner* — Rudy Zervigon
(74) *Attorney, Agent, or Firm* — Patterson + Sheridan LLP

(57) ABSTRACT

Embodiments described herein generally relate to a processing chamber having one or more gas inlet ports located at a bottom of the processing chamber. Gas flowing into the processing chamber via the one or more gas inlet ports is directed along a lower side wall of the processing chamber by a plate located over each of the one or more gas inlet ports or by an angled opening of each of the one or more gas inlet ports. The one or more gas inlet ports and the plates may be located at one end of the processing chamber, and the gas flow is directed towards an exhaust port located at the opposite end of the processing chamber by the plates or the
(Continued)

angled openings. Thus, more gas can be flowed into the processing chamber without dislodging particles from a lid of the processing chamber.

11 Claims, 15 Drawing Sheets

(51) Int. Cl.
*C23C 16/455* (2006.01)
*H01L 21/02* (2006.01)

(52) U.S. Cl.
CPC .. *C23C 16/45582* (2013.01); *H01L 21/02247* (2013.01); *H01L 21/02614* (2013.01)

(58) Field of Classification Search
USPC ........................ 118/715; 156/345.33, 345.34
See application file for complete search history.

(56) References Cited

U.S. PATENT DOCUMENTS

| | | | |
|---|---|---|---|
| 2008/0121178 A1* | 5/2008 | Bang | C23C 16/4405 118/723 I |
| 2010/0109259 A1* | 5/2010 | Cayzac | B60R 16/0222 277/606 |
| 2010/0132615 A1* | 6/2010 | Kato | C23C 16/402 118/725 |
| 2011/0186229 A1* | 8/2011 | Hayashi | B05B 1/18 156/345.34 |
| 2015/0011095 A1 | 1/2015 | Chandrasekharan et al. | |

OTHER PUBLICATIONS

Taiwanese Office Action (with attached English translation) for Application No. 106113356; dated Sep. 5, 2019; 9 total pages.

* cited by examiner

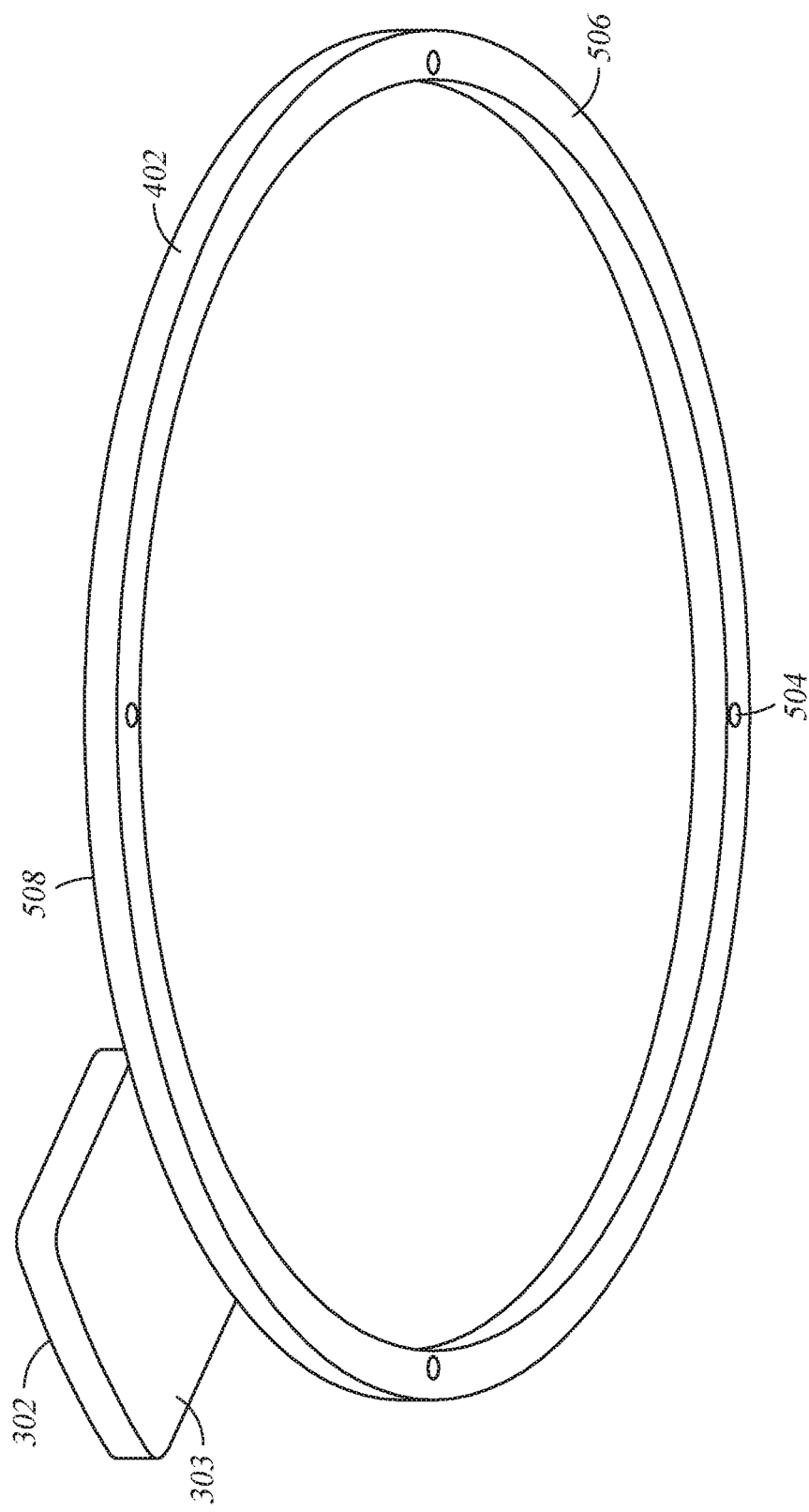

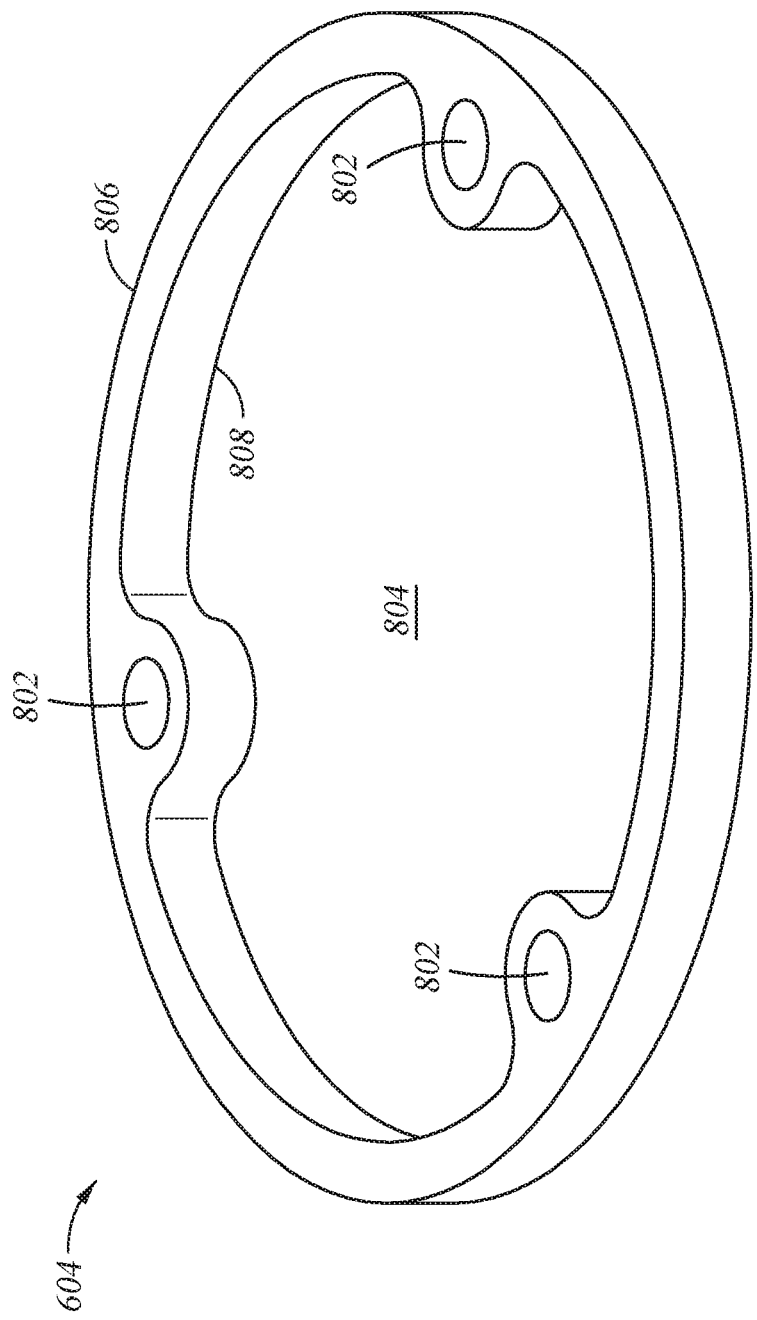

EFFECTIVE AND NOVEL DESIGN FOR LOWER PARTICLE COUNT AND BETTER WAFER QUALITY BY DIFFUSING THE FLOW INSIDE THE CHAMBER

CROSS-REFERENCE TO RELATED APPLICATIONS

This application claims priority to U.S. Provisional Patent Application Ser. No. 62/345,631, filed on Jun. 3, 2016 and U.S. Provisional Patent Application Ser. No. 62/379,987, filed on Aug. 26, 2016. Each of aforementioned patent applications is incorporated herein by reference.

BACKGROUND

Field

Embodiments described herein generally relate to apparatus and methods for processing a semiconductor substrate. More particularly, embodiments described herein relate to a processing chamber having one or more gas inlet ports located at a bottom of the processing chamber.

Description of the Related Art

In the field of integrated circuit and flat panel display fabrication, multiple deposition and etching processes are performed in sequence on a substrate among one or more process chambers to form various design structures. A substrate processing system may be equipped with multiple chambers for performing these processes, such as etching, physical vapor deposition (PVD), chemical vapor deposition (CVD), nitridation, chamber cleaning and conditioning, etc. Many of the processes may be performed in a processing chamber under a vacuum condition, and the processing chamber may be pressurized to the atmospheric pressure when removing the substrate from the processing chamber or during maintenance of the processing chamber. In addition, purging of the processing chamber may be performed in between process steps.

Conventionally, a port for introducing a purge gas or for pressurizing the processing chamber, such as a processing chamber used for nitridation, is located on a lid of the processing chamber. It has been discovered that particle contamination on a substrate disposed within the processing chamber shows a lid nozzle pattern, indicating the source of contamination is the port located in the lid. In addition, the opening of the port is limited so the flow rate of purge or pressurizing gas flowed into the processing chamber is slow, leading to a long purge and pressurizing time.

Therefore, an improved apparatus is needed to increase the flow rate of the purge or pressurizing gas without increasing particle contamination on the substrate.

SUMMARY

In one embodiment, a processing chamber includes a bottom, a lower side wall disposed on the bottom, an upper side wall disposed on the lower side wall, a lid disposed on the upper side wall, a process gas injection port disposed on the lid, and one or more gas inlet ports located in the bottom for introducing a purge gas or pressurizing gas into the processing chamber. The one or more gas inlet ports are adjacent to the lower side wall. The processing chamber further includes an exhaust enclosure coupled to the bottom.

In another embodiment, a processing chamber includes a bottom having a first region and a second region, and a lower side wall disposed on the bottom. The lower side wall has a first region and as second region. The processing chamber further includes an upper side wall disposed on the first region of the lower side wall, a lid disposed on the upper side wall, a process gas injection port disposed on the lid, and one or more gas inlet ports located in the first region of the bottom for introducing a purge gas or pressurizing gas into the processing chamber. The one or more gas inlet ports are adjacent to the first region of the lower side wall. The processing chamber further includes an exhaust enclosure coupled to the second region of the bottom.

In another embodiment, a processing chamber includes a bottom having a first region and a second region, and a lower side wall disposed on the bottom. The lower side wall has a first region and as second region. The processing chamber further includes an upper side wall disposed on the first region of the lower side wall, a lid disposed on the upper side wall, a process gas injection port disposed on the lid, and one or more gas inlet ports located in the first region of the bottom for introducing a purge gas or pressurizing gas into the processing chamber. The one or more gas inlet ports are adjacent to the first region of the lower side wall. The processing chamber further includes one or more plates disposed within the processing chamber. Each plate of the one or more plates is disposed over a corresponding gas inlet port of the one or more gas inlet ports. The processing chamber further includes an exhaust enclosure coupled to the second region of the bottom.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 5 is a schematic perspective view of a screw cover according to one embodiment described herein.

FIG. 8 is a schematic perspective view of a retainer according to one embodiment described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a processing chamber having one or more gas inlet ports located at a bottom of the processing chamber. Gas flowing into the processing chamber via the one or more gas inlet ports is directed along a lower side wall of the processing chamber by a plate located over each of the one or more gas inlet ports or by an angled opening of each of the one or more gas inlet ports. The one or more gas inlet ports and the plates may be located at one end of the processing chamber, and the gas flow is directed towards an exhaust port located at the opposite end of the processing chamber by the plates or the angled openings. Thus, more gas can be flowed into the processing chamber without dislodging particles from a lid of the processing chamber.

Figure 1:
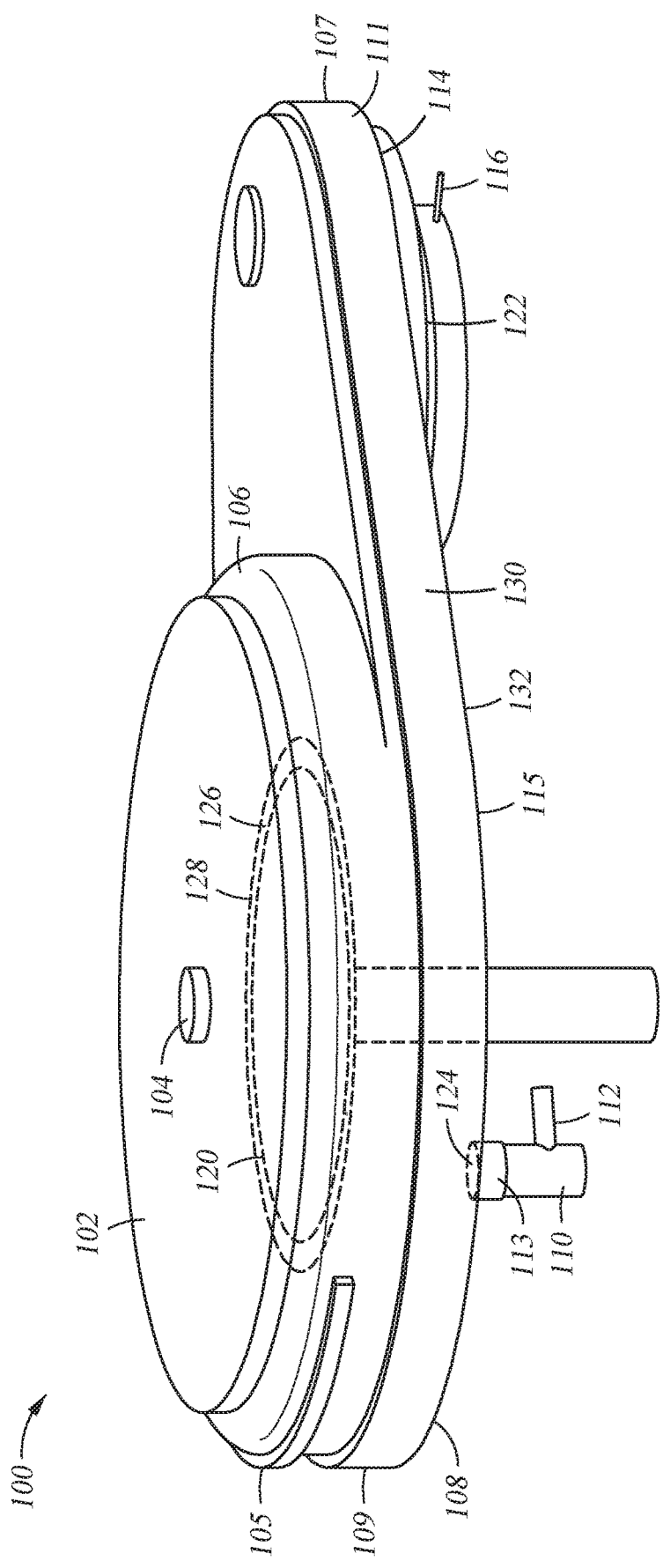
FIG. 1 is a schematic perspective view of a processing chamber according to one embodiment described herein.

FIG. 1 is a schematic perspective view of a processing chamber 100 according to one embodiment described herein. As shown in FIG. 1, the processing chamber 100 includes a bottom 115, a lower side wall 107 disposed on the bottom 115, an upper side wall 106 disposed on the lower side wall 107, a lid 102 disposed on the upper side wall 106, and a process gas injection port 104 disposed on the lid 102. The processing chamber 100 may be any suitable vacuum processing chamber, such as a nitridation chamber. A substrate 120 is placed in the processing chamber 100 at a location surrounded by the upper side wall 106. The substrate 120 may be supported by a substrate support 126 disposed in the processing chamber 100. A slit valve door 105 is located in the upper side wall 106 for sealing a slit valve opening for transferring the substrate 120 into and out of the processing chamber 100. The lower side wall 107 is disposed below the upper side wall 106 and the slit valve door 105. The upper side wall 106 may be circular or non-circular. In the embodiment of FIG. 1, the upper side wall 106 is circular. The lower side wall 107 includes a first region 109 and a second region 111. The upper side wall 106 is disposed on the first region 109 of the lower side wall 107. The first region 109 is located directly below the upper side wall 106 and the second region 111 extends laterally beyond the upper side wall 106. The first region 109 of the lower side wall 107 is semi-circular and may have a diameter that is substantially the same as a diameter of the upper side wall 106. The second region 111 of the lower side wall 107 is also semi-circular and may have a diameter that is the same as, or smaller than, the diameter of the first region 109 of the lower side wall 107. In FIG. 1, the diameter of the semi-circular second region 111 is smaller than the diameter of the first region 109. The lower side wall 107 may include two connecting regions 130 connecting the first region 109 and the second region 111 of the lower side wall 107. The connecting regions 130 of the lower side wall 107 may be linear. The bottom 115 of the processing chamber 100 has a first region 108, a second region 114, and connecting regions 132. The first region 108 of the bottom 115 is coupled to the first region 109 of the lower side wall 107, the second region 114 of the bottom 115 is coupled to the second region 111 of the lower side wall 107, and the connecting regions 132 are coupled to the connecting regions 130 of the lower side wall 107. An exhaust enclosure 122 is coupled to the second region 114 of the bottom 115, and a gas outlet 116 is located on the exhaust enclosure 122 for allowing gases inside of the processing chamber 100 to exit the processing chamber 100. The gas outlet 116 may be connected to a vacuum pump (not shown) for creating a vacuum condition inside of the processing chamber 100.

Typically a purge gas for purging the processing chamber 100 or an inert gas for pressurizing the processing chamber 100 is introduced into the processing chamber 100 via the process gas injection port 104. However, in many cases the opening of the process gas injection port 104 is limited so the flow rate of purge gas or pressurizing gas introduced into the processing chamber 100 is slow. In addition, particles accumulated on the lid 102 of the processing chamber 100 fall on the substrate 120 as the purge or pressurizing gas is introduced into the processing chamber 100 via the process gas injection port 104, particularly if the flow rate of purge gas or pressurizing gas through the port 104 is increased.

In order to increase the flow rate of the purge or pressurizing gas flowing into the processing chamber 100 without causing the particles accumulated on the lid 102 to fall onto the substrate 120, a gas inlet 110 may be located in the first region 108 of the bottom 115 for introducing purge gas or pressurizing gas into the processing chamber 100. The gas inlet 110 includes a conduit 112 for receiving purge gas or pressurizing gas from a gas source, such as a gas panel (not shown). A diffuser (not shown) may be disposed inside the gas inlet 110. The gas inlet 110 is coupled to the first region 108 of the bottom 115 at a gas inlet port 124, which is adjacent to the first region 109 of the lower side wall 107. The gas inlet port 124 is located at a periphery of the chamber to avoid flowing gas toward the substrate support 126. Thus, purge gas or pressurizing gas flows into the processing chamber 100 from the gas inlet 110 towards the lid 102 and does not impinge on the substrate support 126 because the substrate support 126 has an edge 128 located radially inward from the flow path of purge gas or pressurizing gas. In some embodiments, the gas introduced into the processing chamber 100 from the gas inlet 110 may impinge on the lid 102 at a velocity that would not cause the particles on the lid 102 to fall. In order to increase the amount of gas flowing into the processing chamber 100 via the gas inlet 110 without increase the velocity of the gas, a gas expansion device 113 may be utilized. The gas expansion device 113 may be coupled to the gas inlet 110, as shown in FIG. 1, or disposed inside of the gas inlet 110. The gas expansion device 113 may be any suitable gas expansion device. With the gas expansion device 113, while the amount of purge gas or pressuring gas introduced into the processing chamber 100 is increased, the velocity of purge gas or pressurizing gas flowing into the processing chamber 100 is not increased. As a result, even if purge gas or pressurizing gas impinges on the lid 102 of the processing chamber 100, particles on the lid 102 are not dislodged from the lid 102 by the gas introduced via the gas inlet 110 due to the slow velocity of the gas.

In some embodiments, the gas expansion device 113 is omitted, and an opening of the gas inlet 110 inside of the processing chamber 100 may be utilized to increase the amount of gas flowing into the processing chamber 100 via the gas inlet 110 without dislodging particles from the lid 102. FIG. 2A is a schematic side view of the gas inlet 110 having an angled opening 202 according to one embodiment described herein. As shown in FIG. 2A, the angled opening 202 may form an angle A with a basis plane 201 of the processing chamber 100. The basis plane 201 of the processing chamber may be substantially parallel to a processing surface of the substrate 120. The angle A may be greater than zero degrees in order to direct purge gas or pressurizing gas 204 towards the second region 111 of the lower side wall 107, such as from the first region 109 towards the second region 111 of the lower side wall 107. In other words, purge gas or pressurizing gas is directed to flow along one of the connecting regions 130 of the lower side wall 107. The lower side wall 107 is located below the upper side wall 106, which surrounds the substrate 120, so that purge gas or pressurizing gas flowing along the lower side wall 107 does not impinge on the substrate 120. Thus, the velocity of the gas flowing into the processing chamber 100 via the gas inlet 110 can be increased since the gas is not flowing directly towards the lid 102 of the processing chamber. The angled opening 202 may be circular or any other suitable shape.

Figure 2B:
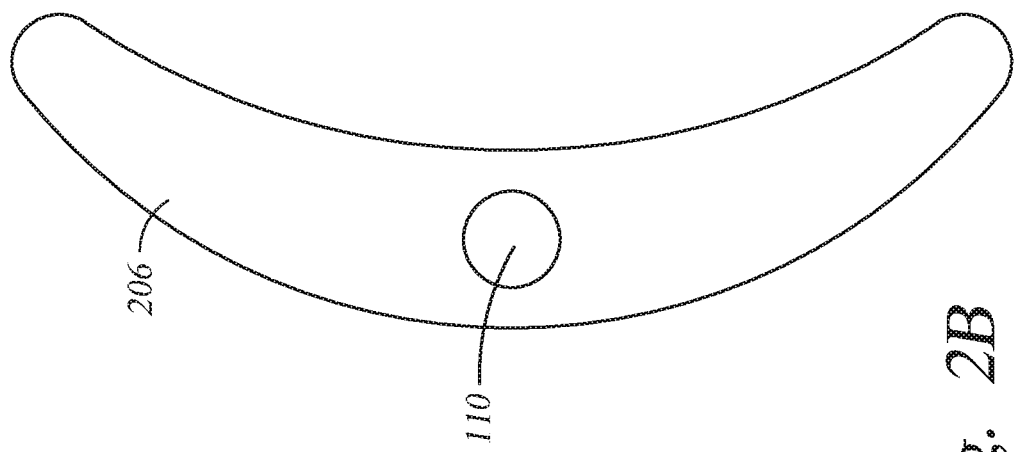
FIG. 2B is a schematic top view of the gas inlet port having a slit-like opening according to another embodiment described herein.
Figure 2A:
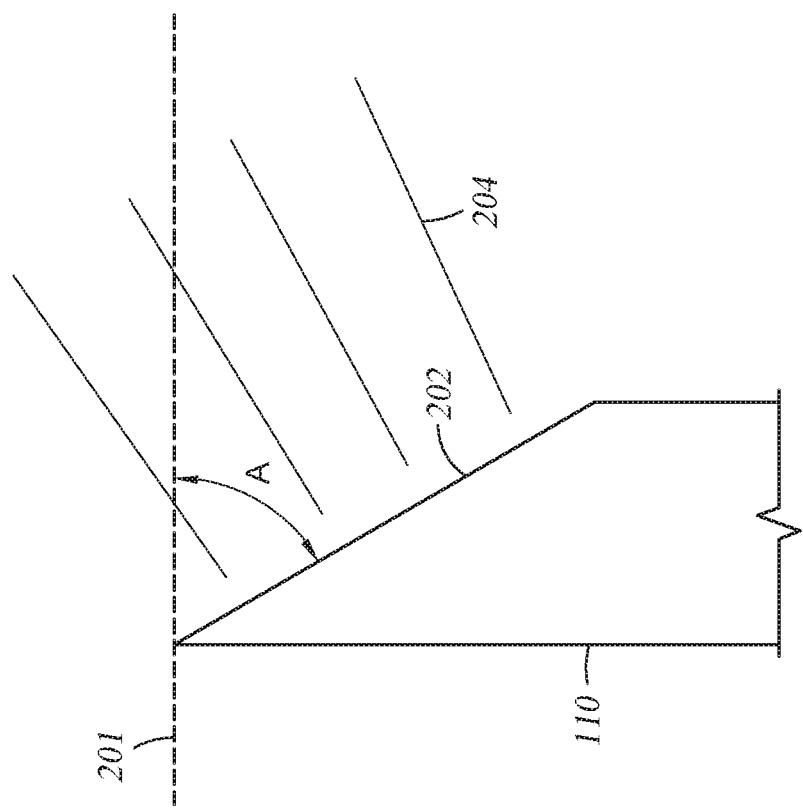
FIG. 2A is a schematic side view of a gas inlet port having an angled opening according to one embodiment described herein.

FIG. 2B is a schematic top view of the gas inlet 110 having a slit-like opening 206 according to one embodiment described herein. In one embodiment, the slit-like opening 206 is the gas inlet port 124 shown in FIG. 1. As shown in FIG. 2B, the area of the slit-like opening 206 is greater than a circular opening, such as an area of the opening of the gas inlet 110. Thus, more purge gas or pressurizing gas can flow into the processing chamber 100 through the slit-like opening 206 without increasing the velocity of purge gas or pressurizing gas. The slit-like opening 206 may be adjacent to the lower side wall 107 and may have a curved shape that is conforming to the azimuth of the lower side wall 107. In some embodiments, the slit-like opening 206 may be planar, i.e., the slit-like opening 206 forms an angle of about zero degrees with the basis plane 201. In other embodiments, the slit-like opening 206 may be angled, as shown in FIG. 2A.

Figure 3:
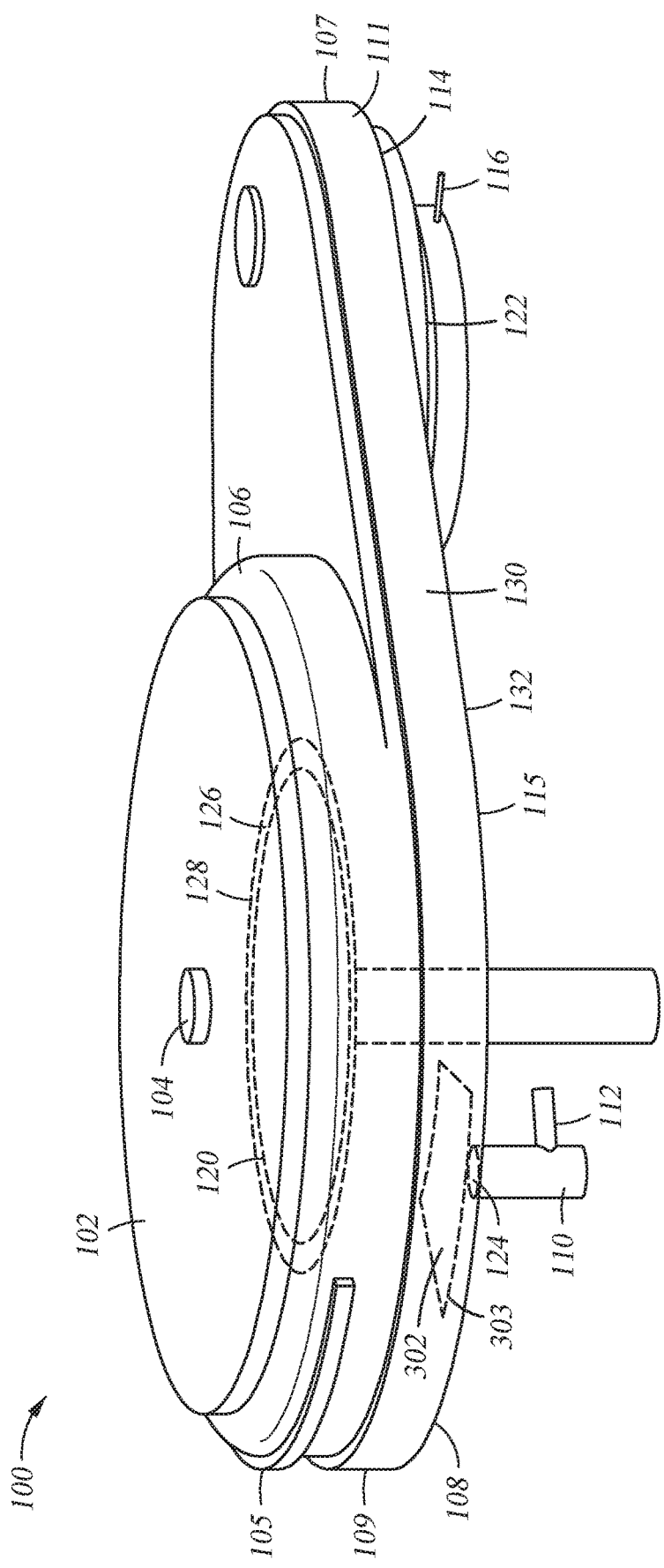
FIG. 3 is a schematic perspective view of a processing chamber according to another embodiment described herein.

FIG. 3 is a schematic perspective view of the processing chamber 100 according to another embodiment described herein. As shown in FIG. 3, the gas expansion device 113 is omitted, and a plate 302 is disposed in the processing chamber 100 over the gas inlet port 124 formed in the first region 108 of the bottom 115. The plate 302 is utilized to direct purge gas or pressurizing gas to flow along the lower side wall 107. Since purge gas or pressurizing gas flowing into the processing chamber 100 is not flowing directly towards the lid 102, the velocity of the gas can be increased without dislodging particles from the lid 102. The plate 302 may be fabricated from any suitable material, such as stainless steel, aluminum, quartz, alumina or a high performance material (HPM). The HPM is composed of a compound $Y_4Al_2O_9$ and a solid solution $Y_{2-x}Zr_xO_3$ ($Y_2O_3$—$ZrO_2$ solid solution). The plate 302 may be coated with yttria or HPM. In one example, the plate 302 is fabricated from quartz. In another example, the plate 302 is fabricated from stainless steel and coated with yttria or HPM. The plate 302 may have any suitable shape. In one example, the plate 302 is rectangular. The plate 302 includes a major surface 303 facing the gas inlet port 124. The surface 303 may have a surface area that is greater than the gas inlet port 124. The surface 303 may have a surface area that is smaller than or equal to the gas inlet port 124.

Figure 4:
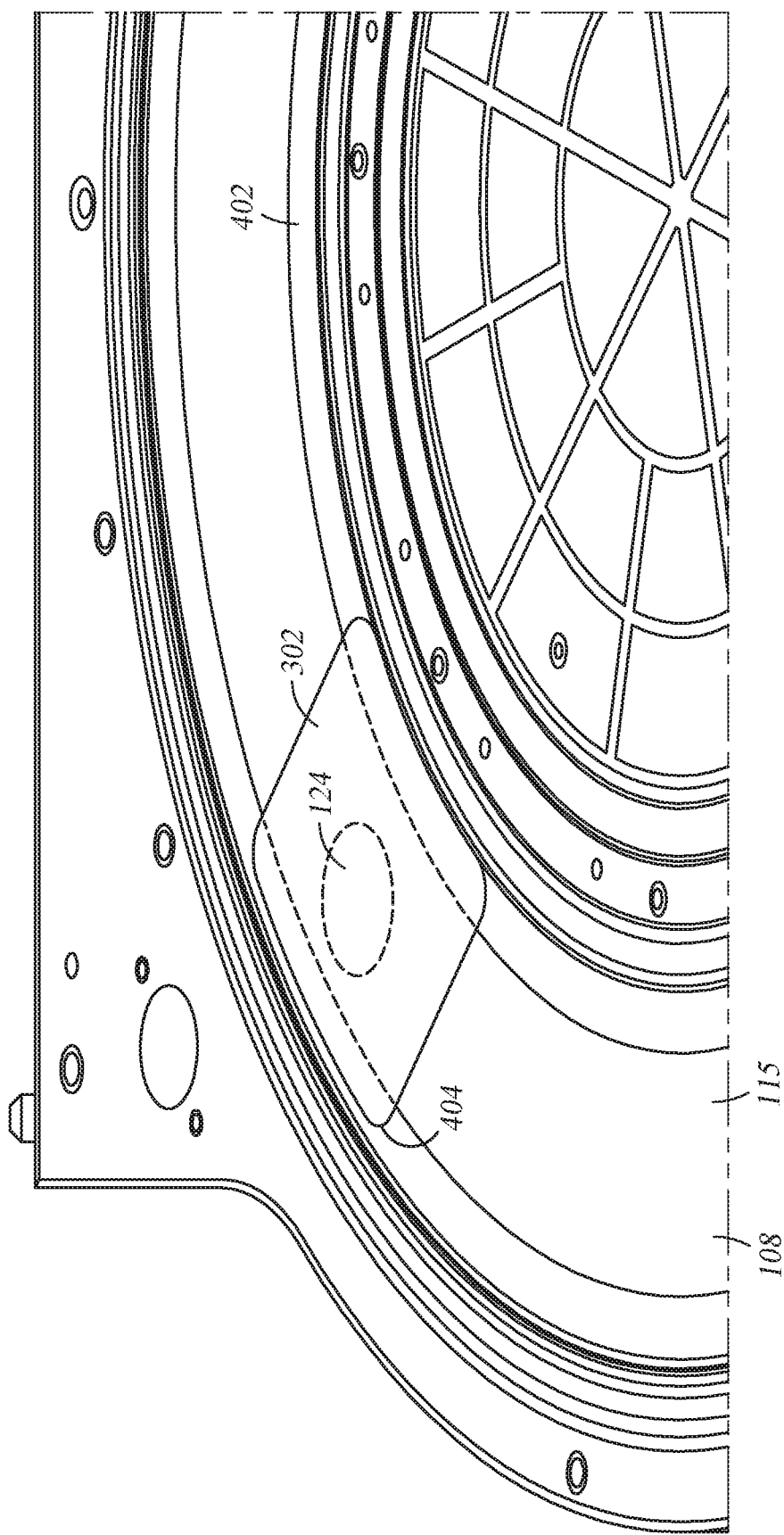
FIG. 4 is a schematic top view of a portion of a bottom of the processing chamber shown in FIG. 1 according to one embodiment described herein.

FIG. 4 is a schematic top view of a portion of the bottom 115 of the processing chamber 100 shown in FIG. 1 according to one embodiment described herein. As shown in FIG. 4, the gas inlet port 124 is formed in the first region 108 of the bottom 115 adjacent to the first region 109 of the lower side wall 107, and the plate 302 is disposed over the gas inlet port 124 for preventing purge gas or pressurizing gas flowing into the processing chamber 100 from impinging on the lid 102 at a high velocity. The gas inlet port 124 is larger than the process gas injection port 104 (FIG. 1) to allow flowing purge gas or pressurizing gas into the processing chamber 100 at a higher flow rate than is achievable through the process gas injection port 104. The plate 302 is coupled to a screw cover 402 disposed on the first region 108 of the bottom 115 to provide stability for the plate 302. The plate 302 may be rectangular with rounded corners 404, as shown in FIG. 4. The plate 302 may have any other suitable shape.

FIG. 5 is a schematic perspective view of the screw cover 402 according to one embodiment described herein. The screw cover 402 may be annular, as shown in FIG. 5, and may include a plurality of recesses 504 formed in a bottom surface 506. The screw cover 402 may be fabricated from any suitable material. The screw cover 402 may be fabricated from the same material as the plate 302. In one example, the screw cover 402 is fabricated from quartz or HPM. The screw cover 402 may have an inner diameter that is smaller than a diameter of the substrate 120 (FIG. 1). The plurality of recesses 504 may cover a plurality of screws located in the bottom 115 and may be used to align the plate 302 to be over the gas inlet port 124. The plate 302 may be coupled to an upper surface 508 of the screw cover 402 by any suitable fastening method, for example welding. In one embodiment, the plate 302 and the screw cover 402 are a single piece of material.

Figure 6A:
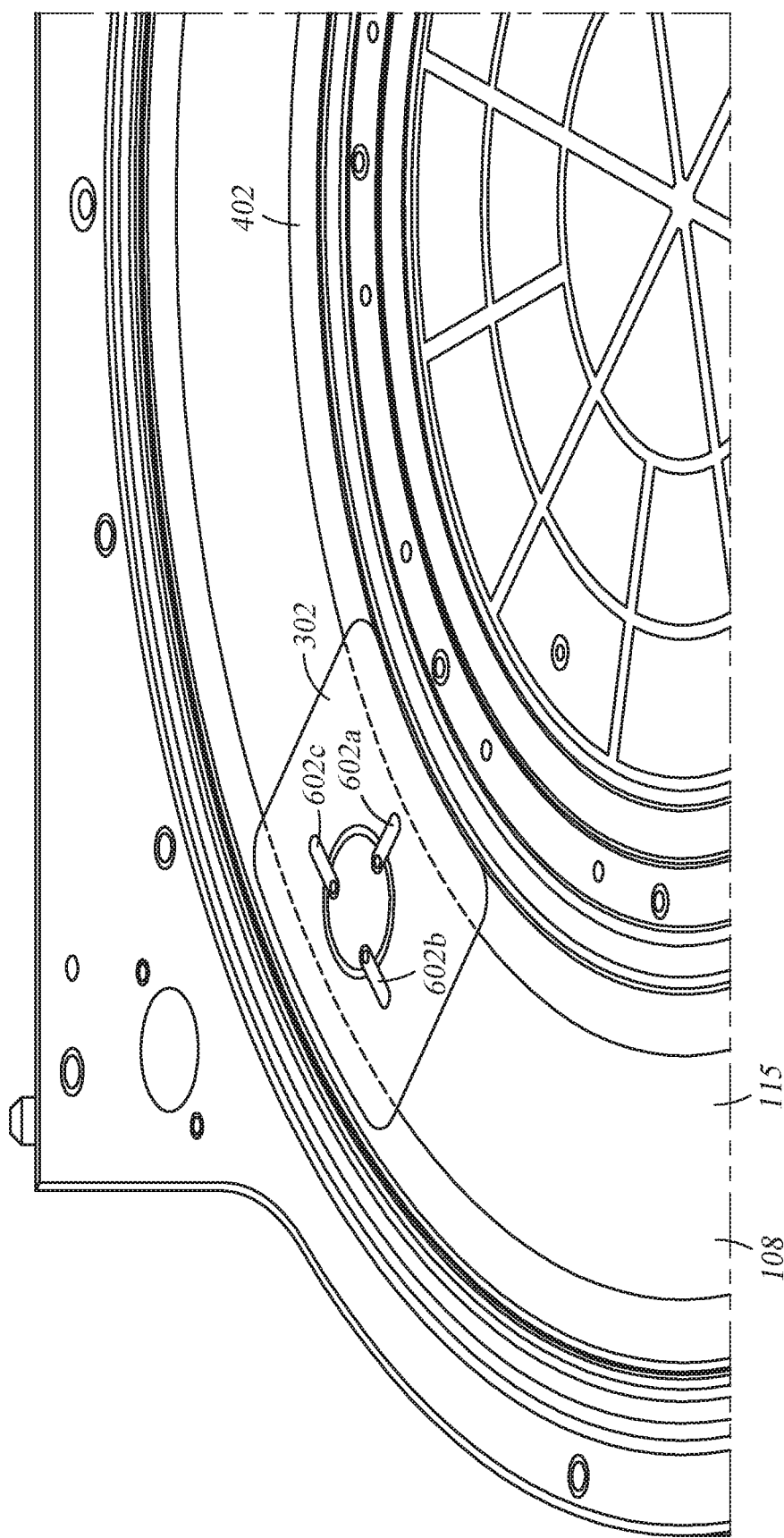
FIG. 6A is a schematic top view of a portion of a bottom of the processing chamber shown in FIG. 1 according to another embodiment described herein.

FIG. 6A is a schematic top view of a portion of the bottom 115 of the processing chamber 100 shown in FIG. 1 according to another embodiment described herein. As shown in FIG. 6A, the gas inlet port 124 is formed in the first region 108 of the bottom 115 adjacent to the first region 109 of the lower side wall 107, and the plate 302 is disposed over the gas inlet port 124 for preventing purge gas or pressurizing gas flowing into the processing chamber 100 from impinging on the lid 102 at a high velocity.

The plate 302 is supported by a plurality of supports 602 that rest on the first region 108 of the bottom 115 or equivalents thereof. The supports 602 may be coupled to the plate 302 at any suitable locations for supporting and securing the plate 302 and for directing purge gas or pressurizing gas entering the processing chamber 100 via the gas inlet port 124. The thickness of the supports 602 define a gap between the plate 302 and the bottom 115, and purge gas or pressurizing gas enters into the processing chamber 100 flowing through the gap. In one embodiment, three supports 602A, 602B, 602C are utilized, as shown in FIG. 6A. A first support 602A of the three supports 602 may be oriented along a radius of the first region 108 of the bottom 115, while the second and third supports 602B, 602C are oriented along a line perpendicular to the radius that orients the first support 602A, as shown in FIG. 6A. The second and third supports 602B, 602C may be located along a line crossing two points on the edge of the gas inlet port 124. The plurality of supports 602A, 602B, 602C may be located at the edge of the gas inlet port 124, as shown in FIG. 6A, or located a distance away from the edge of the gas inlet port 124. In one embodiment, the plurality of supports 602A, 602B, 602C are disposed a distance away from the edge of the gas inlet port 124, and the supports 602A, 602B, 602C are fastened, such as bolted, to the bottom 115 of the processing chamber 100 for securing the plate 302. The thickness of each of the supports 602 may be equal to or greater than a thickness of the screw cover 402. In one embodiment, the thickness of each of the supports 602A, 602B, 602C equals to the thickness of the screw cover 402, and the plate 302 is in contact with the screw cover 402. In another embodiment, the plate 302, screw cover 402, and supports 602A, 602B, 602C are one piece of material.

Figure 6B:
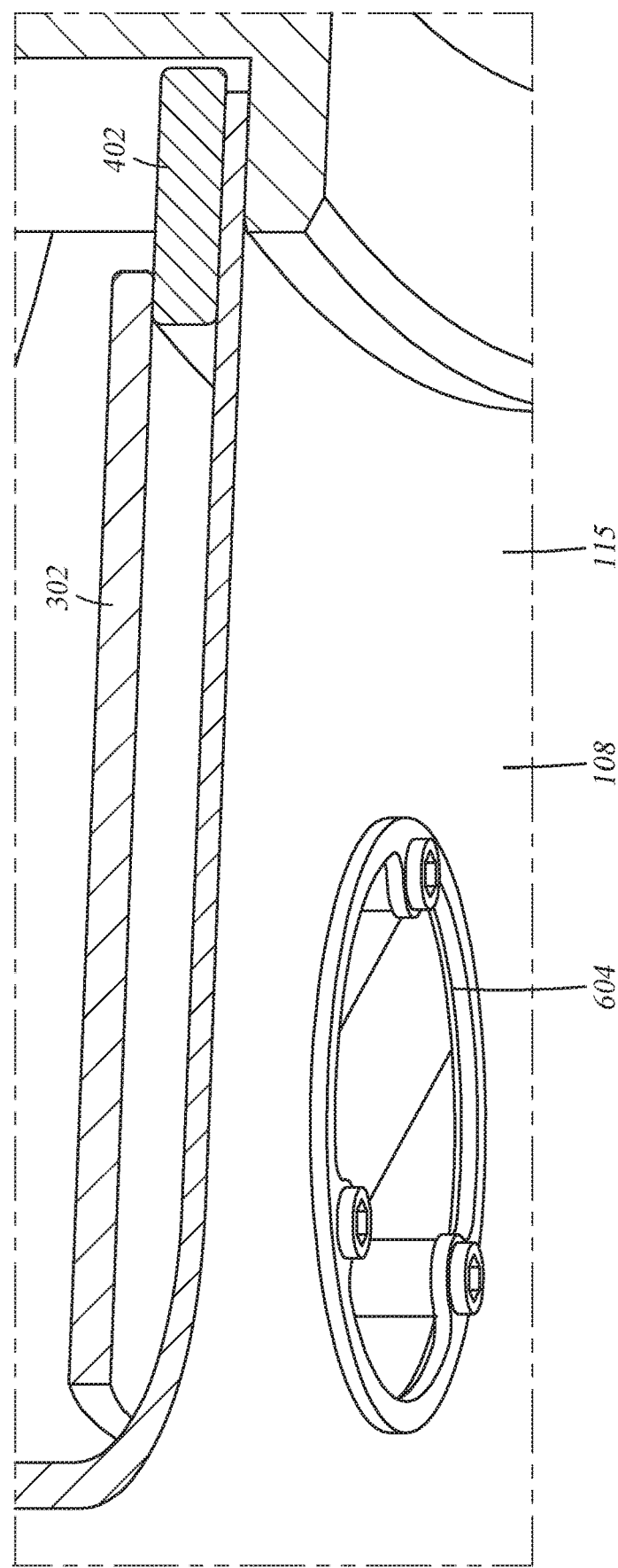
FIG. 6B is a schematic bottom view of the portion of the bottom of the processing chamber shown in FIG. 6A according to one embodiment described herein.

FIG. 6B is a schematic bottom view of the portion of the bottom 115 of the processing chamber 100 shown in FIG. 6A according to one embodiment described herein. As shown in FIG. 6B, the plate 302 may be supported by the plurality of supports 602 (FIG. 6A) and may be in contact with the screw cover 402. A retainer 604 may be located in the gas inlet port 124 for securing the plate 302 over the gas inlet port 124. The retainer 604 may be fabricated from any suitable material. In one embodiment, the retainer 604 is fabricated from aluminum. The retainer 604 is described in more detail in FIG. 8. The plate 302 may be directly fastened, such as welded or joined to the bottom 115.

Figure 7A:
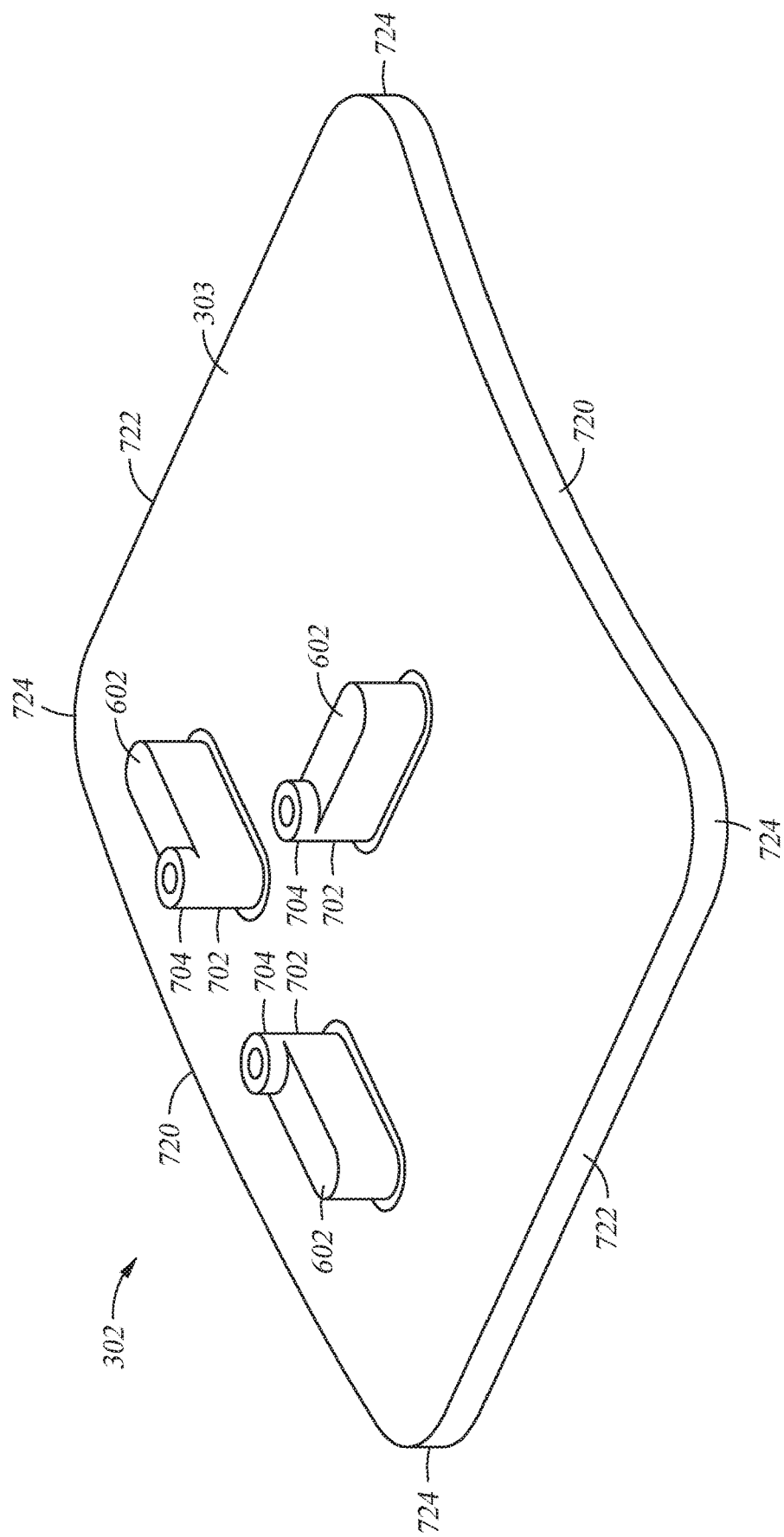
FIG. 7A is a schematic perspective view of a plate according to one embodiment described herein.

FIG. 7A is a schematic perspective view of the plate 302 according to one embodiment described herein. As shown in FIG. 7A, the plate includes the surface 303 and the plurality of supports 602 formed on the surface 303. The plurality of supports 602 may be fabricated from the same material as the plate 302. The supports 602 may have any shape that is suitable for supporting the plate 302. The plate 302 may have any shape that is suitable to accommodate in the processing chamber 100. In one embodiment, as shown in FIG. 7A, the supports 602 have the same bar-like shape. The supports 602 may have different shapes in order to further direct the flow of purge gas or pressurizing gas, which flows along the surface 303 when the plate 302 is installed in the chamber. The plurality of supports 602 may be coupled to the surface 303 by any suitable method. In one embodiment, the plurality of supports 602 and the plate 302 are a single piece of material. In order to secure the plate 302 over the gas inlet port 124, a plurality of columns 702 may be formed on the surface 303 of the plate 302. Each column 702 may be coupled to a corresponding support 602, as shown in FIG. 7A. In the embodiment that the supports 602 are a distance away from the edge of the gas inlet port 124, each support 602 is a distance away from a corresponding column 702. In one embodiment, there are three supports 602 and three columns 702, as shown in FIG. 7A. Each column 702 may include an end portion 704 extending away from the corresponding support 602, and the end portion 704 may be inserted into a corresponding opening 802 (FIG. 8) formed in the retainer 604. In other words, each column 702 has a thickness that is greater than the thickness of each support 602, and the difference between the thickness of each column 702 and the thickness of each support 602 is the thickness of the end portion 704. The thickness of columns 702 and supports 602 is defined as extending away from the surface 303 of the plate 302. The columns 702 may be cylindrical, as shown in FIG. 7A. The columns 702 may be any other suitable shape. The columns 702 may be fabricated from the same material as the supports 602. The columns 702 may or may not be an integral part of the bottom 115, the plate 302, or the expansion device 113.

Figure 7B:
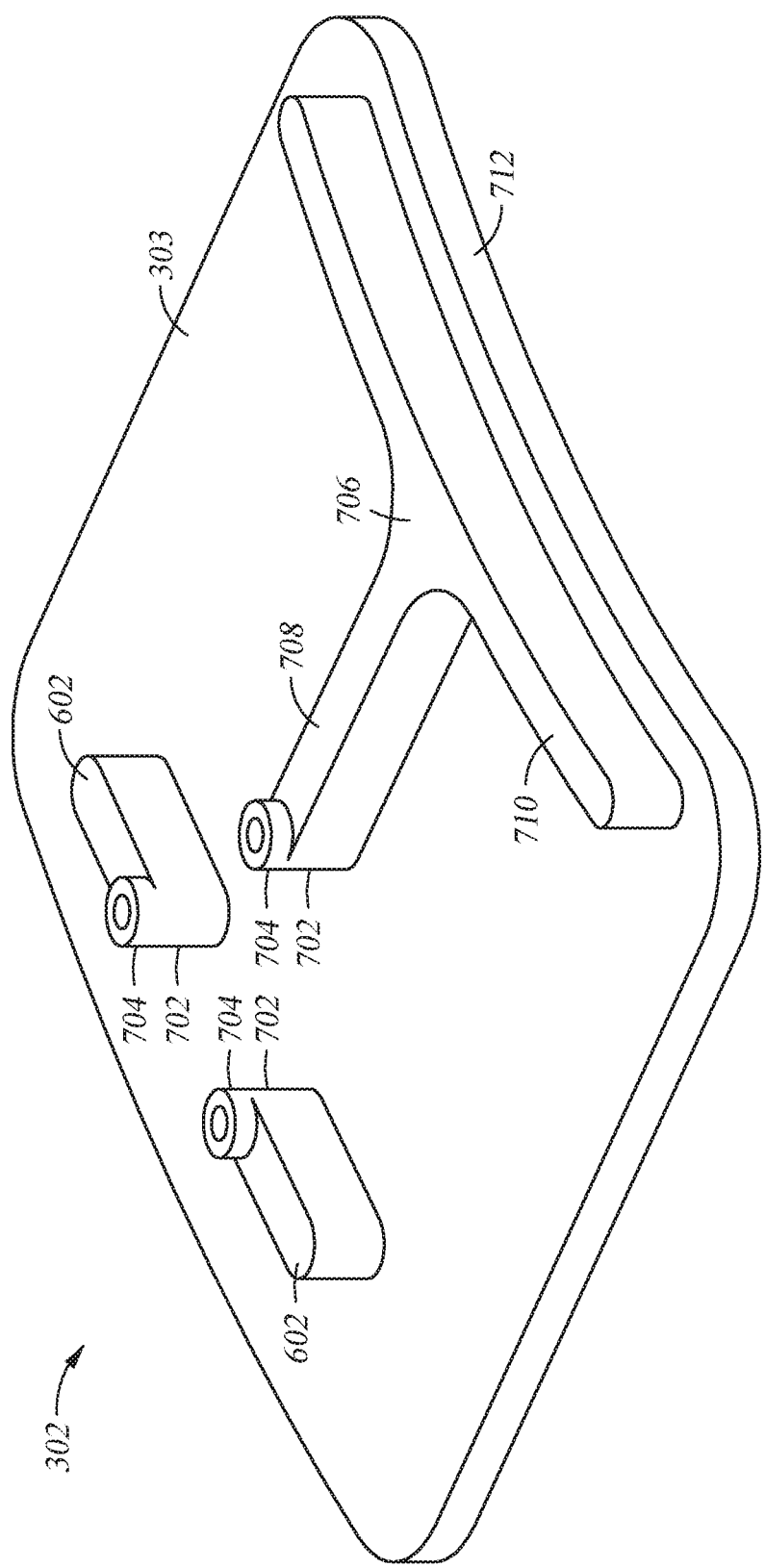
FIG. 7B is a schematic perspective view of the plate according to another embodiment described herein.

FIG. 7B is a schematic perspective view of the plate 302 according to another embodiment described herein. As shown in FIG. 7B, the plate 302 has the surface 303 facing the gas inlet port 124 (FIG. 4). In the embodiment of FIG. 7B, the plate 302 is not rectangular. In FIG. 7B, the plate 302 has two curved sides 720 and two straight sides 722, and the curved sides 720 and the straight sides 722 are joined by rounded corners 724. The curved sides 720 conform to the azimuth of the lower side wall 107. In other words, the curved sides 720 are arcs of circles centered at the center of the substrate support 126 (FIG. 1). The two straight sides 722 may be substantially parallel to each other. The plurality of supports 602 and the plurality of columns 702 may be formed on the surface 303 of the plate 302. One or more supports 602 may have a different shape than the rest of the supports 602 in order to further direct the flow of purge gas or pressurizing gas entering into the processing chamber 100. In one embodiment, as shown in FIG. 7B, a support 706 includes a first portion 708 and a second portion 710. The first portion 708 may be oriented along a radius of the first region 108 of the bottom 115. The second portion 710 may be bar-like and disposed along a long edge 712 of the plate 302. The first portion 708 may be connected to the second portion 710 at the center of the second portion 710. The connection area may be T-shaped or may make a curved transition from the first portion 708 to the second portion 710. The first portion 708 may be bar-like and substantially perpendicular to the second portion 710, as shown in FIG. 7B.

FIG. 8 is a schematic perspective view of the retainer 604 according to one embodiment described herein. As shown in FIG. 8, the retainer 604 is a ring and may include an outer edge 806, an inner edge 808, and an opening 804 formed within the inner edge 808. During operation, the purge or pressurizing gas enters the processing chamber through the opening 804. A plurality of openings 802 may be formed between the outer edge 806 and the inner edge 808. The openings 802 may be configured to engaging with corresponding second portions 704 of the plate 302. Each second portion 704 may be inserted into a corresponding opening 802 for securing the plate 302 over the gas injection port 110. In some embodiments, the second portions 704 are further secured to the retainer 604 by fasteners, such as screws, that fasten into the second portions 704 through the openings 802. In one embodiment, there are three columns 702 formed on the plate 302 and three openings 802 formed in the retainer 604.

Figure 9:
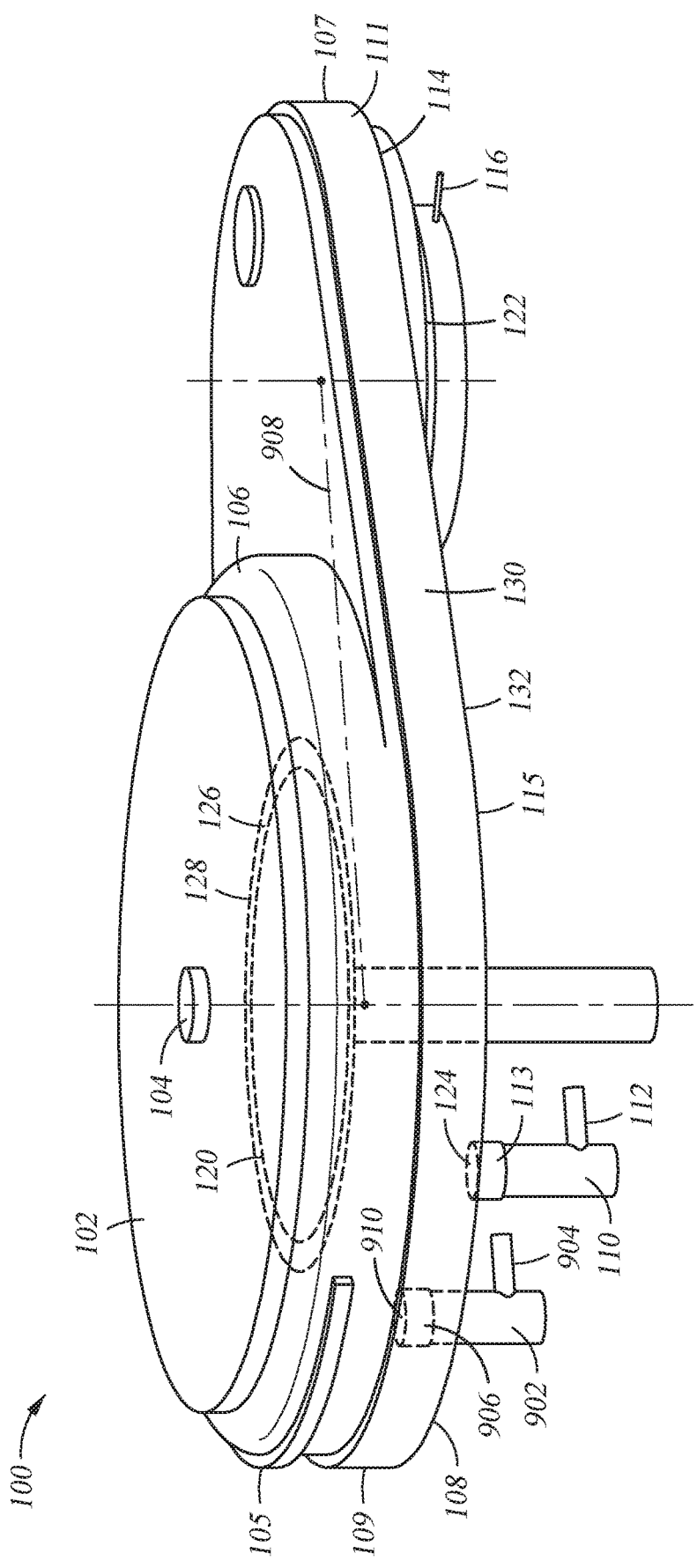
FIG. 9 is a schematic perspective view of a processing chamber according to another embodiment described herein.

FIG. 9 is a schematic perspective view of the processing chamber 100 according to another embodiment described herein. The processing chamber 100 may include the same components as the processing chamber 100 shown in FIG. 1, with an additional gas inlet 902 located in the first region 108 of the bottom 115. The gas inlet 902 may be coupled to a gas inlet port 910 formed in the first region 108 of the bottom 115, and the gas inlet port 910 may be adjacent to the first region 109 of the lower side wall 107. The gas inlet 902 may include a conduit 904 for receiving purge gas or pressurizing gas from a gas source, such as a gas panel (not shown). The gas inlet 902 may be identical to the gas inlet 110. The gas inlet ports 124, 910 may be symmetrically located on the bottom 115 with respect to an axis 908 extending from the first region 108 to the second region 114 of the bottom 115. With two gas inlets 110, 902 for introducing purge gas or pressurizing gas into the processing chamber 100, the velocity of the gas from each gas inlet 110, 902 is slow enough so the particles on the lid 102 would not fall as the gas impinges on the lid 102, while the amount of gas entering the processing chamber 100 is doubled.

In some embodiments, a gas expansion device 906 is coupled to the gas inlet 902 or disposed within the gas inlet 902 in order to further increase the amount of gas entering the processing chamber 100 without increasing the velocity of the gas. In some embodiments, the gas expansion device 906 is omitted, and the gas inlet 902 may have an opening shown in FIGS. 2A and/or 2B in order to further increase the amount of gas entering the processing chamber 100.

Figure 10:
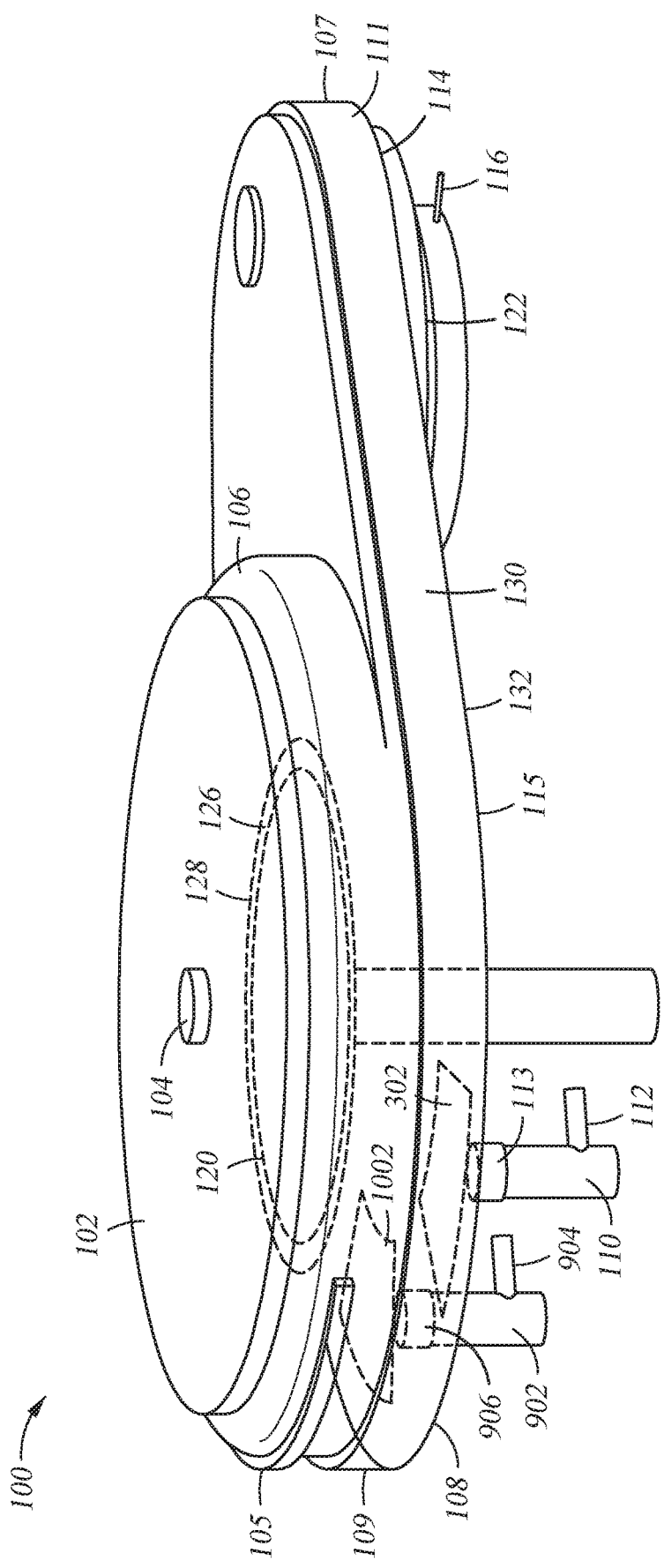
FIG. 10 is a schematic perspective view of a processing chamber according to another embodiment described herein.

FIG. 10 is a schematic perspective view of the processing chamber 100 according to another embodiment described herein. The processing chamber 100 may include the same components as the processing chamber 100 shown in FIG. 9, with additional plates 302, 1002 located over the gas inlets 110, 902, respectively. The plate 1002 may be the same as the plate 302. In one embodiment, both plates 302, 1002 are coupled to the screw cover 402 shown in FIG. 5. In another embodiment, the plate 1002 is supported by a plurality of supports, such as the plurality of supports 602 shown in FIG. 7A. The plate 1002 may be secured by a retainer, such as the retainer 604 shown in FIG. 8. By having two gas inlets 110, 902 and two plates 302, 1002, more gas at higher velocity can enter the processing chamber 100 without impinging on the lid 102, leading to reduced time for purging and pressurizing the processing chamber 100. The two plates 302, 1002 may be a single plate instead of two separate plates, such that a single plate may cover both gas inlets 110, 902.

Figure 11A:
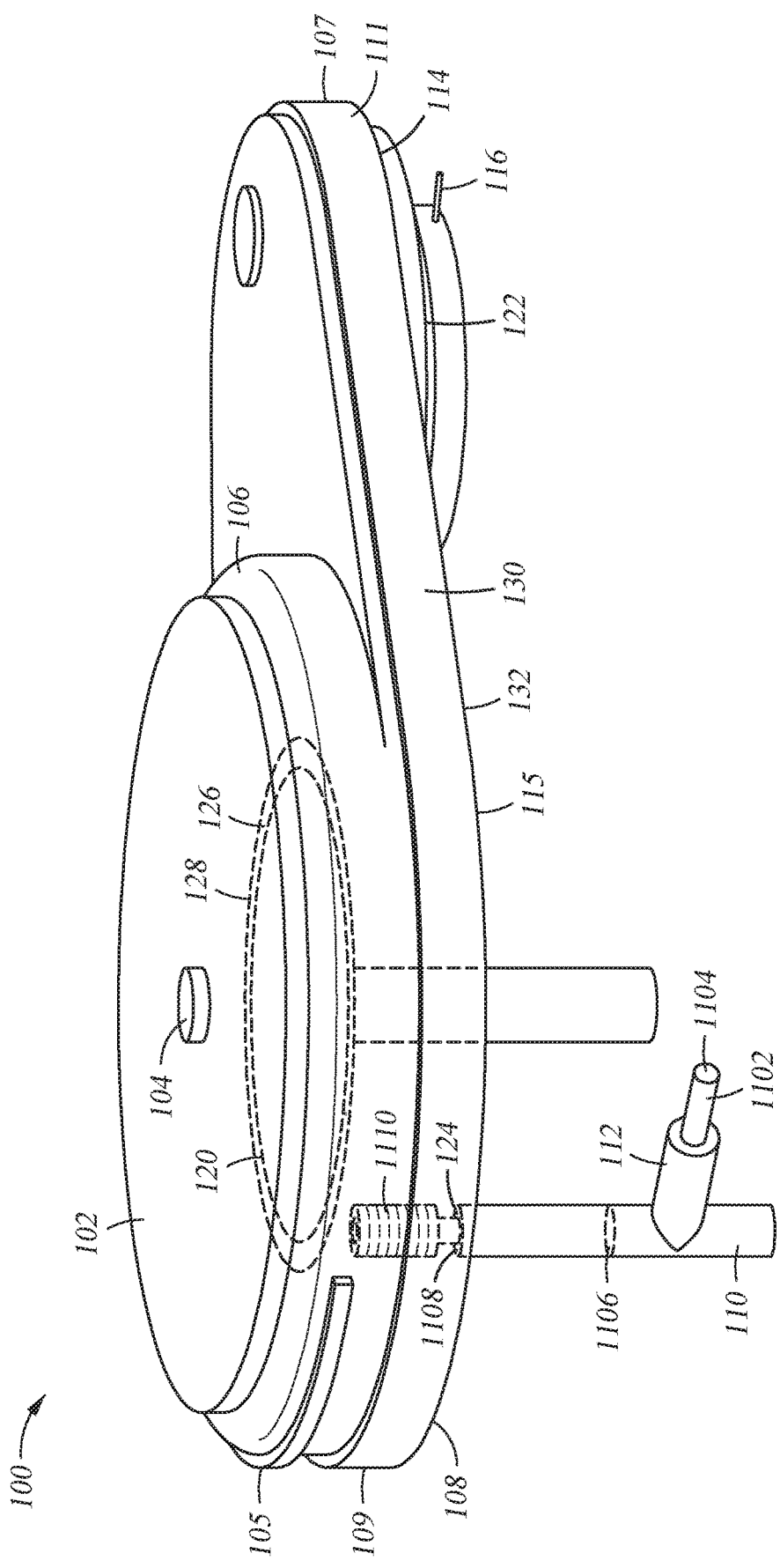
FIGS. 11A-11C are schematic perspective views of a processing chamber according to embodiments described herein.
Figure 11B:
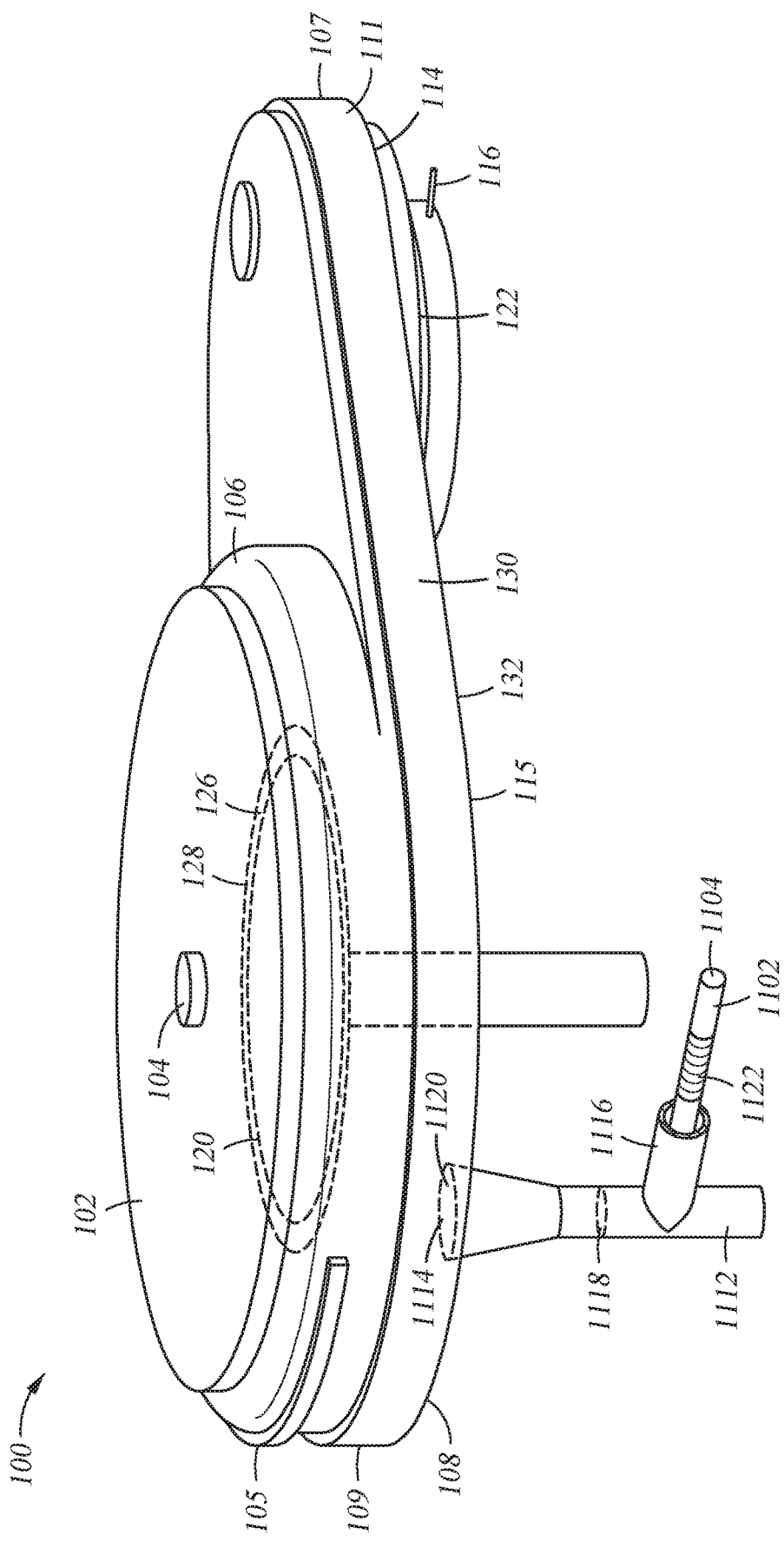
Figure 11C:
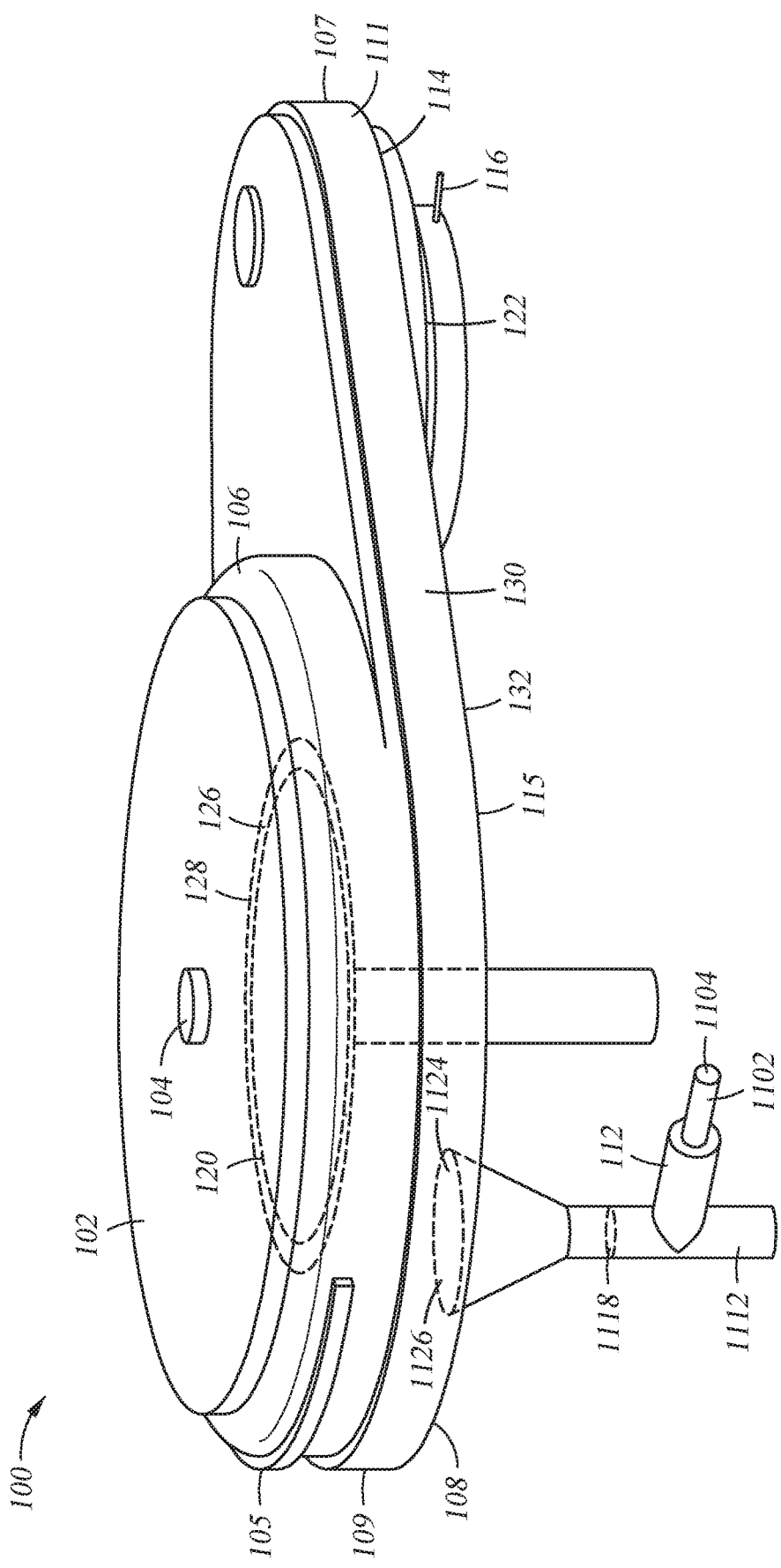

FIGS. 11A-11C are schematic perspective views of a processing chamber according to embodiments described herein. As shown in FIG. 11A, the processing chamber 100 includes the bottom 115, the lower side wall 107, the upper side wall 106, the lid, and the process gas injection port 104. The processing chamber 100 also includes the gas inlet 110 coupled to the bottom 115 at the gas inlet port 124. The gas inlet 110 includes the conduit 112 coupled to a supply pipe 1102. The supply pipe 1102 has a first cross-sectional area 1104, the gas inlet 110 has a second cross-sectional area 1106, and the gas inlet port 124 has a third cross-sectional area 1108. In one embodiment, the first cross-sectional area 1104, the second cross-sectional area 1106, and the third cross-sectional area 1108 are substantially the same. In another embodiment, the first cross-sectional area 1104 is smaller than the second cross-sectional area 1106 or the third cross-sectional area 1108. The first, second, or third cross-sectional areas 1104, 1106, 1108 is smaller than an area from which purge gas or pressurizing gas can flow into the processing chamber 100 without causing the particles on the lid 102 to fall. In order to reduce the velocity of the gas flowing into the processing chamber from the gas inlet 110, a diffuser 1110 is coupled to the gas inlet port 124. The gas diffuser 1110 may be surrounded by the lower side wall 107. The gas diffuser 1110 diffuses the gas flowing into the processing chamber 100 from the gas inlet 110. Thus, even if purge gas or pressurizing gas impinges on the lid 102 of the processing chamber 100, particles on the lid 102 are not dislodged from the lid 102 by the gas introduced via the gas inlet 110 due to the diffuser 1110.

As shown in FIG. 11B, the processing chamber 100 includes the bottom 115, the lower side wall 107, the upper side wall 106, the lid 102, and the process gas injection port 104. The processing chamber 100 also includes a gas inlet 1112 coupled to the bottom 115 at a gas inlet port 1114. The gas inlet 1112 includes a conduit 1116 coupled to the supply pipe 1102. The supply pipe 1102 has the first cross-sectional area 1104, the gas inlet 1112 has a second cross-sectional area 1118, and the gas inlet port 1114 has a third cross-sectional area 1120. In one embodiment, the first cross-sectional area 1104 is smaller than the second cross-sectional area 1118, which is smaller than the third cross-sectional area 1120. A diffuser 1122 is disposed within the conduit 1116 to diffuse the gas introduced from the supply pipe 1102. Because the second cross-sectional area 1118 is larger than the first cross-sectional area 1104, and the third cross-sectional area 1120 is larger than the second cross-sectional area 1118, more purge gas or pressurizing gas can flow into the processing chamber 100 through the gas inlet 1112 without increasing the velocity of purge gas or pressurizing gas. The third cross-sectional area 1120 is large enough to allow purge gas or pressurizing gas flowing into the processing chamber 100 without causing the particles on the lid 102 to fall.

As shown in FIG. 11C, the processing chamber 100 includes the bottom 115, the lower side wall 107, the upper side wall 106, the lid 102, and the process gas injection port 104. The processing chamber 100 also includes the gas inlet 1112 coupled to the bottom 115 at a gas inlet port 1124. The gas inlet 1112 includes the conduit 1116 coupled to the supply pipe 1102. The supply pipe 1102 has the first cross-sectional area 1104, the gas inlet 1112 has the second cross-sectional area 1118, and the gas inlet port 1124 has a third cross-sectional area 1126. In one embodiment, the first cross-sectional area 1104 is smaller than the second cross-sectional area 1118, which is smaller than the third cross-sectional area 1126. The third cross-sectional area 1126 is larger than the third cross-sectional area 1120 (FIG. 11B). Because the third cross-sectional area 1126 is much larger, more purge gas or pressurizing gas can flow into the processing chamber 100 through the gas inlet 1112 without increasing the velocity of purge gas or pressurizing gas without utilizing a diffuser. The third cross-sectional area 1126 is large enough to allow purge gas or pressurizing gas flowing into the processing chamber 100 without causing the particles on the lid 102 to fall.

FIGS. 11A-11C each show one gas inlet coupled to the bottom 115 of the processing chamber 100. In some embodiments, two or more gas inlets may be coupled to the bottom 115 of the processing chamber 100.

The gas inlet and gas inlet port described herein may be located at a bottom, a top, or a side of a processing chamber in order to allow purge gas or pressurizing gas flowing into the processing chamber without causing the particles on the lid to fall and to allow more purge gas or pressurizing gas flowing into the processing chamber through the gas inlet without increasing the velocity of purge gas or pressurizing gas.

While the foregoing is directed to embodiments of the present disclosure, other and further embodiments of the disclosure may be devised without departing from the basic scope thereof, and the scope thereof is determined by the claims that follow.

What is claimed is:

1. A processing chamber, comprising:
   a bottom;
   a lower side wall disposed on the bottom;
   an upper side wall disposed on the lower side wall;
   a lid disposed on the upper side wall;
   a substrate support;
   a process gas injection port disposed on the lid;
   one or more gas inlet ports located in the bottom for introducing a purge gas or pressurizing gas into the processing chamber, wherein the one or more gas inlet ports are adjacent to the lower side wall, the one or more gas inlet ports located radially outward from an edge of the substrate support;
   one or more plates, wherein each plate of the one or more plates is disposed over a corresponding gas inlet port of the one or more gas inlet ports; and
   an exhaust enclosure coupled to the bottom.

2. The processing chamber of claim 1, further comprising one or more gas inlets, wherein each gas inlet of the one or more gas inlets is coupled to a corresponding gas inlet port of the one or more gas inlet ports, wherein each gas inlet of the one or more gas inlets includes an opening that forms an angle greater than zero degrees with a basis plane of the processing chamber for directing the purge gas or pressurizing gas to flow along the lower side wall.

3. The processing chamber of claim 1, wherein the one or more plates are coupled to a screw cover disposed on the bottom.

4. The processing chamber of claim 1, wherein each plate of the one or more plates is supported by a plurality of supports disposed on the bottom.

5. A processing chamber, comprising:
a bottom;
a lower side wall disposed on the bottom;
an upper side wall disposed on the lower side wall;
a lid disposed on the upper side wall;
a substrate support;
a process gas injection port disposed on the lid;
one or more gas inlet ports located in the bottom for introducing a purge gas or pressurizing gas into the processing chamber, wherein the one or more gas inlet ports are adjacent to the lower side wall, the one or more gas inlet ports located radially outward from an edge of the substrate support;
an exhaust enclosure coupled to the bottom; and
a retainer disposed in each gas inlet port of the one or more gas inlet ports.

6. A processing chamber, comprising:
a bottom having a first region and a second region;
a substrate support;
a lower side wall disposed on the bottom, wherein the lower side wall has a first region and a second region;
an upper side wall disposed on the first region of the lower side wall;
a lid disposed on the upper side wall;
a process gas injection port disposed on the lid;
one or more gas inlet ports located in the first region of the bottom for introducing a purge gas or pressurizing gas into the processing chamber, wherein the one or more gas inlet ports are adjacent to the first region of the lower side wall, the one or more gas inlet ports located radially outward from an edge of the substrate support;
one or more plates disposed within the processing chamber, wherein each plate of the one or more plates is disposed over a corresponding gas inlet port of the one or more gas inlet ports; and
an exhaust enclosure coupled to the second region of the bottom.

7. The processing chamber of claim 6, wherein the one or more plates are coupled to a screw cover disposed on the first region of the bottom.

8. The processing chamber of claim 6, wherein each plate of the one or more plates is supported by a plurality of supports coupled to a surface of the plate, wherein the plurality of supports are disposed on the first region of the bottom.

9. The processing chamber of claim 6, further comprising a retainer disposed in each gas inlet port of the one or more gas inlet ports.

10. The processing chamber of claim 9, wherein the retainer comprises an inner edge, an outer edge, and a plurality of opening formed between the inner edge and the outer edge.

11. A processing chamber, comprising:
a bottom having a first region and a second region;
a lower side wall disposed on the bottom, wherein the lower side wall has a first region and a second region, wherein the first region and the second region of the lower side wall are connected so that the lower side wall forms a continuous oval shape, the first region of the lower side wall forming a semi-circle with a first diameter, the second region of the lower side wall forming a semi-circle with a second diameter smaller than the first diameter of the first region;
an upper side wall disposed on the first region of the lower side wall, and the upper side wall having a circular shape;
a lid disposed on the upper side wall;
a process gas injection port disposed on the lid;
a substrate support;
one or more gas inlet ports located in the first region of the bottom for introducing a purge gas or pressurizing gas into the processing chamber, wherein the one or more gas inlet ports are adjacent to the first region of the lower side wall, the one or more gas inlet ports located radially outward from an edge of the substrate support; and
an exhaust enclosure coupled to the second region of the bottom, wherein the exhaust enclosure is located adjacent to the lower side wall radially outward from an edge of the substrate support and at an opposite end of the processing chamber from the one or more gas inlet ports, wherein the one or more gas inlet ports are larger than the process gas injection port.

* * * * *